INVENTOR
H. SEIDEL
BY Sylvan Sherman
ATTORNEY

United States Patent Office 3,486,134

Patented Dec. 23, 1969

3,486,134

FREQUENCY AND AMPLITUDE STABILIZED SIGNAL SOURCES USING FEED-FORWARD TECHNIQUES TO CANCEL ERROR COMPONENTS

Harold Seidel, Warren Township, Somerset County, N.J., assignor to Bell Telephone Laboratories, Incorporated, Murray Hill and Berkeley Heights, N.J., a corporation of New York Filed Apr. 28, 1967, Ser. No. 634,716

Int. Cl. H03c 3/02

U.S. Cl. 332—19 8 Claims

ABSTRACT OF THE DISCLOSURE

A portion of an unstabilized signal, at frequency $f+\delta$, is coupled to a first mixer along with the signal derived from a stabilized signal source, at frequency $$f+\Delta/n$$

where $n$ is a positive integer and $\Delta$ is much larger than the frequency error component $\delta$. The mixer output, which is tuned to the difference frequency $\Delta-\delta$, is amplified and coupled to a second mixer along with the remaining portion of the unstabilized signal, suitably delayed, to produce a frequency stabilized output signal at the sum frequency $f+\Delta$.

BACKGROUND OF THE INVENTION

Until relatively recently, there has been no convenient way of directly generating significant amounts of millimeter wave energy. However, with the development of such solid-state devices as the avalanche diode and the Gunn-effect diode (operating in the limited space-charge accumulation (LSA) mode, as described in an article by L. Weller, entitled "Suppressing Space Charge Improves Gunn Effect," published in the Feb. 7, 1967 issue of Electronics, pp. 127–128), it is now both convenient and economical to generate directly between 100 milliwatts and one watt of millimeter wave energy. Unfortunately, however, oscillators using such devices are relatively unstable both as to frequency and amplitude and, hence, for many practical applications, some sort of stabilization means must be provided.

Typically, an oscillator is stabilized by comparing the oscillator signal with some reference, and developing, thereby, an error signal. The latter is then fed back to the oscillator where it is caused to operate upon some portions of the oscillator in a manner to reduce the error. Obviously, the degree to which the error can be reduced depends upon the system sensitivity. A high degree of sensitivity requires a great deal of system gain, and tends to make the system relatively complicated and expensive. In addition, where fluctuations in the oscillator signal occur at a very rapid rate, it may not be possible for the system to make the necessary corrections due to the inherent time delay in the feed-back circuit.

SUMMARY OF THE INVENTION

It is the broad object of this invention to stabilize both the frequency and amplitude of a signal source in a manner that is inherently independent of both the rate and degree of signal deviation from a prescribed norm.

In accordance with one aspect of the invention, frequency and amplitude stabilization of the output signal from an alternating current signal source is achieved by operating upon the output signal itself, in a feed-forward arrangement, rather than by operating upon the signal source in a feed-back arrangement. Because of the feed-forward feature, whereby both the source signal and the correcting signal propagate along parallel time-equalized circuits, there is no inherent limitation upon the rate at which corrections can be made. Nor is there any residual error inherent in the system since stabilization does not depend upon an error signal whose amplitude is being reduced as the error is being minimized.

In one embodiment of the invention, to be described in greater detail hereinbelow, a portion of the relatively large signal that is to be stabilized is coupled to a first mixer along with a relatively small signal derived from a crystal-controlled source. Designating the frequency of the unstabilized signal $f+\delta$, and that of the crystal-controlled signal $f+\Delta$, where $\Delta$ is much larger than $\delta$, the mixer output is tuned to the difference frequency $\Delta-\delta$. The difference frequency $(\Delta-\delta)$ signal is amplified, and then coupled to a second mixer along with the high level signal $(f+\delta)$, to produce a high level, stabilized output signal at the sum frequency $(f+\Delta)$.

The time delay in the correction signal wavepath is compensated for in the main signal path so that the signal to be corrected and the correction signal are coupled to the second mixer at the proper time.

Amplitude stabilization is achieved by using a parametric upconverter as the second mixer, and by amplitude-limiting the correction signal. In accordance with the Manley-Rowe relationships, the output power is then fixed by the frequency multiplication factor. An isolator is also included in the main signal path to absorb power reflected by the upconverter.

Arrangement for frequency modulating and amplitude modulating the stabilized, high frequency output signal are also described.

In accordance with a second aspect of the invention, a feed-forward arrangement is employed to shape the relative amplitude distribution of the frequency components within a band of frequencies.

These and other objects and advantages, the nature of the present invention, and its various features, will appear more fully upon consideration of the various illustrative embodiments now to be described in detail in in the parallel, low frequency amplifier and mixer wave-

DETAILED DESCRIPTION

Figure 1:
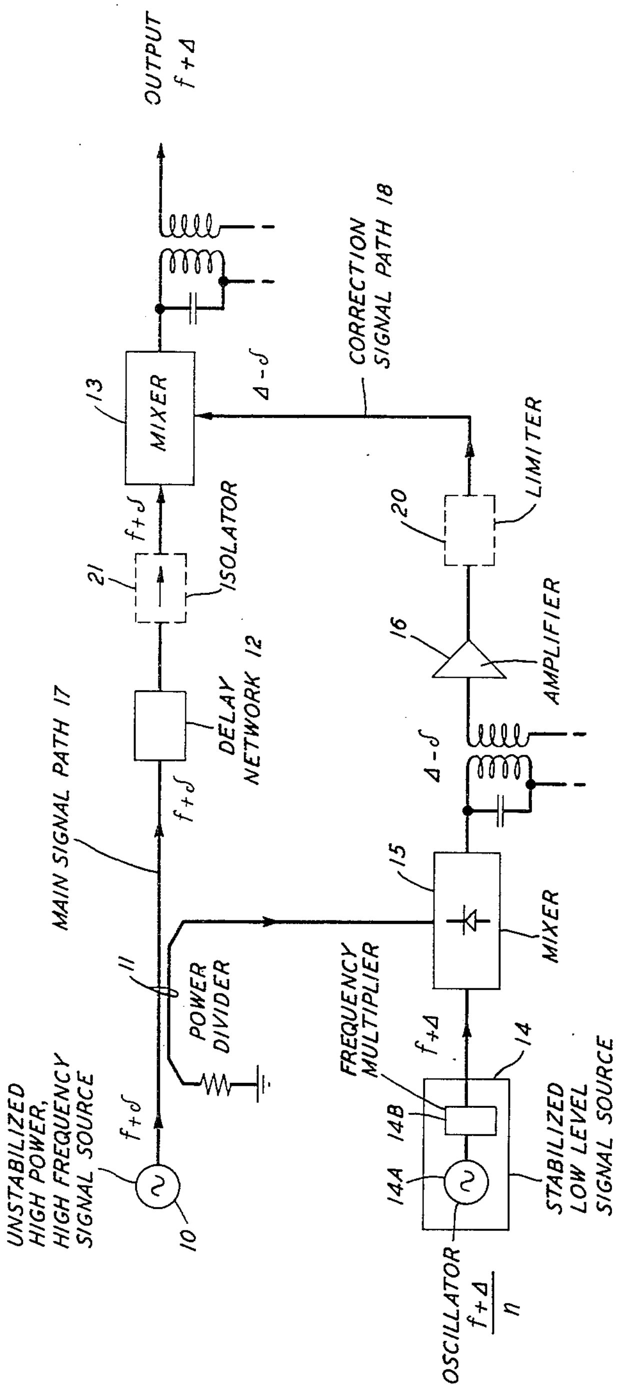
FIG. 1 shows a feed-forward, frequency and amplitude stabilization circuit in accordance with one aspect of the invention.

Referring to the drawings, FIG. 1 shows, in block diagram, a frequency stabilization arrangement in accordance with one aspect of the invention. The circuit includes a relatively high power, high frequency signal source 10, whose output frequency is nominally equal to a particular frequency $f$, but which is unstable and tends to deviate over a range of frequencies. For purposes of explanation, the instantaneous frequency of source 10 is designated as $f+\delta$, where $\delta$ is the error frequency.

A small portion, approximately one percent, of the signal generated by source 10 is coupled by means of a power divider 11, such as a directional coupler, to a first mixer 15. Also coupled to mixer 15 is a second, relatively low level signal, derived from a frequency-stabilized signal source 14. The latter typically comprises a crystal-controlled oscillator 14A, operating at a freqnency $$\frac{f+\Delta}{n}$$

and a freqency multiplier 14B, having a frequency multiplication factor $n$. Alternatively, the low frequency signal derived from oscillator 14A is coupled directly to mixer 15, where the latter is highly nonlinear and capable of generating harmonics at the frequency of interest, $f+\Delta$. Typical of such a device is the so-called "step recovery diode" which is capable of efficiently generating milliwatts of power at frequencies up to and beyond 12 gHz.

The output of the first mixer is tuned to the difference frequency $\Delta-\delta$, where $\Delta$ is much larger than $\delta$. Gain at the difference frequency is provided, as required, by a low frequency amplifier 16, whose output is coupled to a second mixer 13. Also coupled to mixer 13 is the balance of the unstabilized signal derived from source 10. These two signals are added in the mixer and produce a stabilized, high frequency output signal at the sum frequency $f+\Delta$.

It will be noted that the output signal no longer contains the error component $\delta$, but instead includes only the frequency-stabilized components $f$ and $\Delta$. Thus, the frequency of a relatively high frequency, high level power source 10 has been stabilized by means of the relatively low frequency, low level oscillator 14A.

As was mentioned earlier, prior art frequency stabilizing circuits typically feed an error signal back to the oscillator that is to be stabilized. It was also noted, however, that the time delay in the correction circuit can render it impossible to deliver the error signal to the oscillator in time to make the necessary corrections. In the embodiment of FIG. 1, on the other hand, this problem never arises as the correction signal and the main signal are fed forward, and correction is made at a later time. To insure that the correction signal operates upon the appropriate portion of the main signal, a time delay network 12, such as a length of transmission line, is included in the main wavepath 17. The delay provided by the delay network is adjusted such that the time delay along the main wavepath 17 is equal to the time delay along the correction signal wavepath 18. It is apparent in such an arrangement that a proper correction signal can always be applied to the main signal irrespective of the delay in the correction signal wavepath, or the rate at which the frequency error component $\delta$ changes.

It will also be noted that there is a small shift in the nominal frequency of the signal from $f$ to $f+\Delta$. This, however, can be anticipated in the design of signal source 10 by initially tuning source 10 to a frequency $\Delta$ less than the required output frequency. In practice, however, $f$ would typically be of the order of thousands of megacycles while $\Delta$ would be of the order of only megacycles. Hence, the overall frequency shift is negligible.

The block diagram of FIG. 1 also includes, in broken-line blocks, a limiter 20, located in the correction signal path 18, and an isolator 21, located in the main signal path 17. These two additional components are included when amplitude stabilization of the signal is desired along with frequency stabilization. The operation of the amplitude stabilization portion of the circuit is based upon the input-output power-frequency relationships of a reactive upper-sideband upconverter, as defined by the so-called "Manley-Rowe" formulas. (See "Varactor Applications" by P. Penfield, Jr. and R. P. Rafuse, published by M.I.T. Press, page 40, for a discussion of reactive upper-sideband upconverters.)

In a simple upper-sideband upconverter, the signals are applied at frequencies $\omega_1$ and $\omega_2$, and wave energy is extracted at the sum frequency $\omega_3=\omega_1+\omega_2$. The Manley-Rowe formulas state that $$\frac{P_1}{\omega_1}=\frac{P_2}{\omega_2}=\frac{P_3}{\omega_3} \quad (1)$$

where $P_1$, $P_2$ and $P_3$ are the powers of the respective signals. Accordingly, to effect amplitude stabilization in accordance with the invention, the second mixer 13 is a reactive upper-sideband upconverter, and the correction signal is amplitude-limited before being coupled to the upconverter. Since the frequencies are also determined, Equation 1 defines the power relationships among the several signals, and limits the amplitude $P_{f+\Delta}$ of the output signal, since $$P_{f+\Delta}=\frac{P_{\Delta-\delta}}{(\Delta-\delta)}(f+\Delta)\approx P_{\Delta-\delta}\frac{f}{\Delta}$$

where $P_{\Delta-\delta}$ is the power of the correction signal.

Equation 1 also defines the relationship between $P_{f+\delta}$ and $P_{\Delta-\delta}$, and to the extent that the actual power applied to the upconverter at frequency $f+\delta$ exceeds that specified by Manley-Rowe, the excess is reflected back and is absorbed in isolator 21.

The inclusion of a limiter 20 in the correction circuit, rather than directly in the main signal path, is dictated by the practicalities of the situation. In practice, it is much easier and less expensive to generate power at the lower frequency $\Delta$ than at the higher frequency $f$. Accordingly, it is preferable that the gain necessary to adequately drive a limiter be provided in the correction circuit, and that amplitude stabilization be effetced in the manner described.

Figure 2:
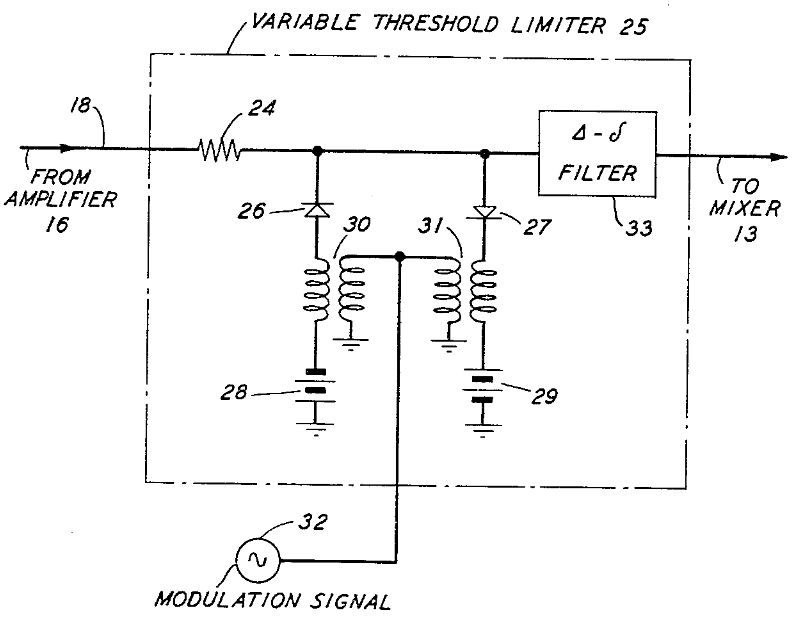
FIG. 2 shows a variable threshold limiter for amplitude modulating the output signal derived from the circuit of FIG. 1.

In addition to stabilizing the amplitude and the frequency of the high frequency signal, the circuit illustrated in FIG. 1 can be readily modified either to frequency modulate or to amplitude modulate the high frequency signal. For example, since the amplitude of the output signal is a function of the amplitude of the correction signal, varying the threshold of limiter 20 provides a convenient way of amplitude modulating the high frequency signal. FIG. 2 illustrates one embodiment of a variable threshold limiter 25, comprising a series-resistor 24 and a pair of oppositely-poled diodes 26 and 27 connected across the correction signal wavepath 18. The instantaneous limiting threshold of the diodes is established by direct current biasing sources 28 and 29 and the modulating signal. The latter, derived from a source 32, is coupled in series with the diodes and the biasing sources by means of transformers 30 and 31. In the absence of a modulating signal, the threshold is determined solely by the D.C. sources 28 and 29. However, in the presence of a modulating signal, the instantaneous limiting threshold varies, thus causing the amplitude of the correction signal to vary. In accordance with Equation 2, variations in $P_{\Delta-\delta}$ cause corresponding variation in the output signal $P_{\delta+\Delta}$.

A filter 33, tuned to $\Delta-\delta$, is advantageously included after the limiter to remove spurious frequency components introduced by the limiting action of the diodes.

Figure 3:
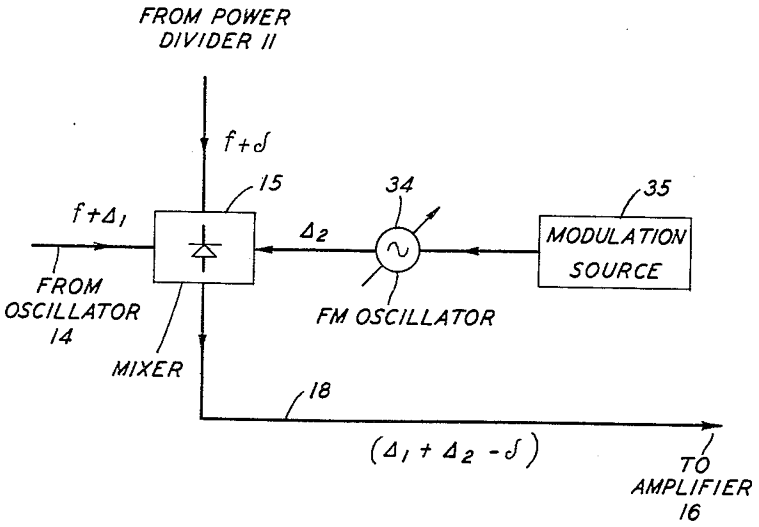
FIG. 3 shows an arrangement for frequency modulating the output signal derived from the circuit of FIG. 1.

Frequency modulation is produced by varying the frequency of the correction signal. This can be conveniently accomplished by dividing the frequency component $\Delta$ into two parts, where one part, $\Delta_1$, is a constant frequency component, produced, as before, by the stabilized signal source 14. The second component, $\Delta_2$, on the other hand, is derived from a separate, frequency-modulated oscillator. Such an arrangement is illustrated in FIG. 3, which shows the first mixer 15 to which there is coupled a portion of the high frequency signal $f+\delta$, the stabilized signal $f+\Delta_1$, and the frequency-modulated signal $\Delta_2$, derived from a frequency-modulated oscillator 34. The latter is modulated in accordance with the signal derived from modulation source 35.

The output circuit of mixer 15 is tuned to frequency $(\Delta_1+\Delta_2-\delta)$. The stabilized output frequency derived from mixer 13 is now $f+\Delta_1+\Delta_2$, and is thus frequency modulated in accordance with the modulation of component $\Delta_2$.

The feed-forward principle can also be employed in a slightly different manner for band shaping purposes. In this second mode of operation, illustrated in FIG. 4, the input signal comprises a band of frequencies $f \pm \delta$, centered at $f$ and extending above and below by an amount $\pm\delta$. In FIG. 5, the amplitude distribution of the signal as a function of frequency is given by curve 50. However, it should be noted that the signal distribution can have any arbitrary shape. As before, a small portion of the signal is coupled from the principal wavepath 48 by means of coupler 40 to a first mixer 43, along with a signal $f+\Delta$ from oscillator 46, to produce a difference frequency signal $\Delta \pm \delta$. The latter is conveniently amplified at this lower frequency, and coupled to a second mixer 45 along with a signal from oscillator 46 to produce the sum frequency signal $f \pm \delta$.

Band shaping is obtained by passing the sum frequency signal through a band rejection filter 47, which passes frequency components below $f-\delta_2$ and above $f+\delta_1$, but rejects all the frequency components therebetween, as indicated by curve 60 in FIG. 6.

The output from filter 47 is then loosely coupled, 180 degrees out of phase with the remaining portion of the input signal, back into wavepath 48, by means of a transformer 42, thereby canceling those signal components of the input signal that lie below frequency $f-\delta_2$ and above frequency $f+\delta_1$, as indicated by the shaded portions of FIG. 5 between curves 50 and 52, and between curves 50 and 51. Since no frequency components are fed back into the principal wavepath over the band of frequencies between $f-\delta_2$ and $f+\delta_1$, that portion of the signal is transmitted unaffected, to produce a truncated output signal.

To insure the proper cancellation of the undesired signal components, a delay network 41 is included in the principal wavepath 48 to compensate for any time delay in the parallel, low frequency amplifier and mixer wavepath.

Figure 4:
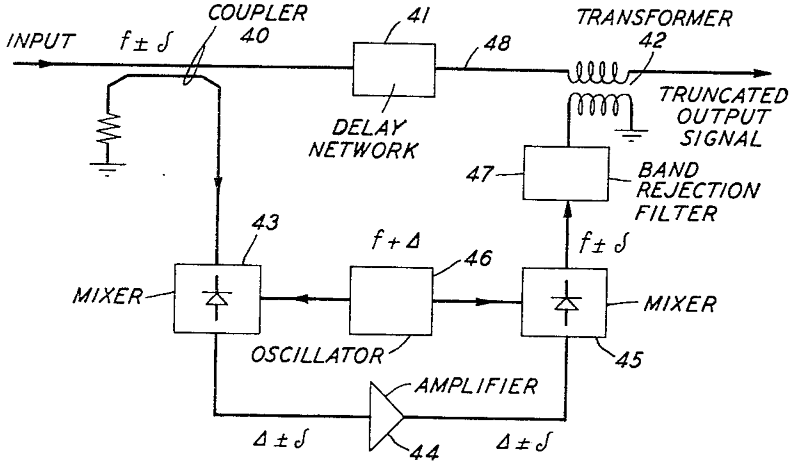
FIG. 4 shows a feed-forward arrangement for shaping the relative amplitude distribution of the frequency components within a band of frequencies.
Figure 5:
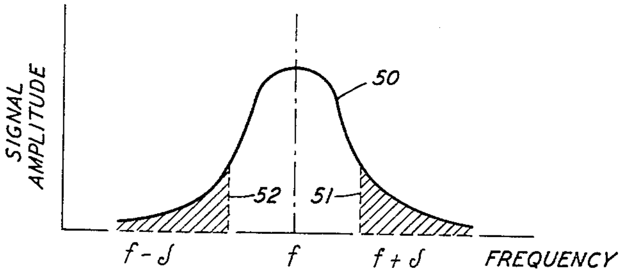
FIG. 5, included for purposes of explanation, shows the relative amplitudes of the frequency components in the input and in the output signals.
Figure 6:
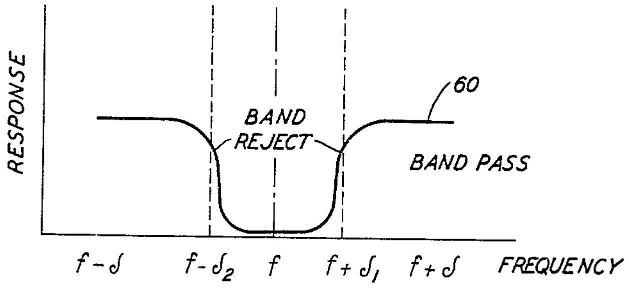
FIG. 6, included for purposes of explanation, shows the frequency response characteristic of the filter used in the arrangement of FIG. 4.

It is understood that the embodiment of FIG. 4 is not limited to the specific use illustrated by the curves shown in FIGS. 5 and 6. More generally, the arrangement of FIG. 4 can be used to imprint any arbitrary frequency distribution upon the output signal merely by the selection of the appropriate filter characteristic. It will be recognized, however, that it frequency components closer to the center frequency, $f$, are to be rejected, mixers 43 and 45, and amplifier 44 must be capable of supplying larger signals for this purpose. In addition, it may also be desirable to include isolators in both the amplifier circuit and in the principal wavepath 48 to absorb the reflected wave energy.

In all cases it is understood that the above-described circuit elements, such as the limiter of FIG. 2, and the specific examples given are illustrative of but a small number of the many possible embodiments which can represent applications of the principles of the invention. Numerous and varied other arrangements can readily be devised in accordance with these principles by those skilled in the art without departing from the spirit and scope of the invention.

What I claim is:

1. A signal stabilization circuit comprising:
a relatively high power, unstabilized signal source having a varying output frequency $f+\delta$;
a relatively low power, frequency-stabilized signal source having a stable output frequency $f+\Delta/n$ where $n$ is an integer, and $\Delta$ is much larger than $\delta$;
a first mixer whose output circuit is tuned to the difference frequency $\Delta-\delta$;
means for coupling a portion of the signal from said unstabilized source to said first mixer;
means for coupling the signal from said stabilized source to said first mixer;
means, including a time-equalization network, for coupling the remaining portion of the signal from said unstabilized source to a second mixer;
means, including an amplifier, for coupling the difference frequency signal from said first mixer to said second mixer;
and means for extracting an output signal from said second mixer at the sum frequency $f+\Delta$.

2. The circuit according to claim 1 wherein said means for coupling a portion of the signal from said stabilized signal source to said first mixer includes a frequency multiplier having a multiplication factor of $n$.

3. The circuit according to claim 1 wherein said second mixer is a reactive upconverter.

4. The circuit according to claim 3 including a limiter for amplitude-limiting the difference frequency signal coupled to said upconverter;
and including an isolator between said unstabilized signal source and said upconverter.

5. The circuit according to claim 3 including means for amplitude modulating the difference frequency signal coupled to said upconverter.

6. The circuit according to claim 1 including means for frequency modulating the difference frequency signal coupled to said second mixer.

7. In combination;
a first signal source having a varying output frequency $f+\delta$, where $\delta$ is a small error component;
a frequency-stabilized signal source having an output frequency $$f+\frac{\Delta_1}{n}$$

where $n$ is an integer;
and a frequency-modulated signal source;
first nonlinear means for mixing a portion of the signal from said first source, the signal from said frequency-stabilized source, and the signal from said frequency-modulated source to produce a low frequency signal $\Delta_1+\Delta_2-\delta$, where $\Delta_2$ is the frequency-modulated signal;
means for coupling said low frequency signal and the remaining portion of the signal from said first source to a second mixer;
and means for extracting from said second mixer a frequency-stabilized, frequency-modulated signal at a frequency $f+\Delta_1+\Delta_2$.

8. In combination;
a signal including frequency components extending over a band of frequencies;
means for coupling a portion of said signal from a principal wavepath and feeding it forward along a parallel wavepath;
means along said parallel wavepath for amplifying and shaping the relative amplitudes of the frequency components of said portion of signal;
time delay means along said principal wavepath for equalizing the time delays along the principal wavepath and along said parallel wavepath;
means for coupling the signal in said parallel wavepath back into said principal wavepath 180° out of phase with the remaining portion of said input signal;
and output means for extracting a modified signal from said combination.

References Cited

UNITED STATES PATENTS

| | | | |
|---|---|---|---|
| 2,470,892 | 5/1949 | Hepp | 332—19 |
| 2,721,980 | 10/1955 | Hopper | 332—23 |
| 2,784,377 | 3/1957 | Hopper | 332—23 |
| 3,054,073 | 9/1962 | Powers | 332—23 X |

ALFRED L. BRODY, Primary Examiner

U.S. Cl. X.R.

307—271; 325—148; 331—23; 332—19, 48